United States Patent [19]
Lin

[11] Patent Number: 5,858,835
[45] Date of Patent: Jan. 12, 1999

[54] METHOD FOR FABRICATING A CAPACTIOR IN A DRAM CELL

[75] Inventor: Chi-Hui Lin, Taipei, Taiwan

[73] Assignee: Nan Ya Technology Corporation, Taoyuan, Taiwan

[21] Appl. No.: 996,193

[22] Filed: Dec. 22, 1997

[30] Foreign Application Priority Data

Jul. 19, 1997 [TW] Taiwan ................................ 86110249

[51] Int. Cl.⁶ ............................................. H01L 21/8242
[52] U.S. Cl. ............................................. 438/253; 438/255
[58] Field of Search ................................ 438/250–256, 438/393–398; 257/309

[56] References Cited

U.S. PATENT DOCUMENTS 5,554,557  9/1996  Koh .
5,622,889  4/1997  Yoo et al. .

*Primary Examiner*—Jey Tsai
*Attorney, Agent, or Firm*—Michael D. Bednarek; Kilpatrick Stockton LLP

[57] ABSTRACT

A method for fabricating a capacitor over a semiconductor substrate is disclosed. The method includes the steps of: forming an insulating layer over the semiconductor substrate; forming a contact opening through the insulating layer to expose a portion of the semiconductor substrate; forming a first polysilicon layer over the insulating layer and filling in the contact opening to electrically contact the semiconductor substrate; patterning the first polysilicon layer to the insulating layer surface, thereby forming a trench for defining a capacitor region; forming a thin polysilicon layer with a rugged surface over the first polysilicon layer and the insulating layer; forming a mask layer over the thin polysilicon layer, wherein the mask layer has a smaller thickness in the trench bottom than in other regions; removing the mask layer in the trench bottom through an anisotropical etch step; removing the uncovered portions of the thin polysilicon layer to expose the insulating layer surface; removing the mask layer, thereby forming a storage electrode consisting of the thin polysilicon layer and the first polysilicon layer; forming a dielectric layer over the storage electrode and the exposed insulating layer; and forming a second polysilicon layer over the dielectric layer.

10 Claims, 5 Drawing Sheets

METHOD FOR FABRICATING A CAPACTIOR IN A DRAM CELL

BACKGROUND OF THE INVENTION

1. Field of the Invention

The present invention relates to a method for fabricating a semiconductor device, and more specifically, to a method for fabricating a capacitor in a dynamic random access memory (DRAM) cell.

2. Description of Related Art

DRAM is an important integrated circuit which has been widely utilized in the electronic information industry. Referring to FIG. 1, a DRAM cell includes a transistor T and a capacitor C. The source of the transistor T is connected to a corresponding bit line BL. The drain of the transistor T is connected to a storage electrode of the capacitor C. The gate is connected to a corresponding word line WL. An opposed electrode of the capacitor C is connected to a constant voltage source. There is a dielectric layer between the storage electrode and the opposed electrode. As known to those skilled in the art, the capacitor C is provided for data storage. Therefore, a large capacitance of the capacitor C is required for preventing data loss and improving the refresh rate.

In a conventional DRAM circuit which has fewer than 1 MB cells, a two-dimensional capacitor structure is utilized for data storage. This capacitor is known as a planar-type capacitor. However, the planar-type capacitor requires a very large base area; otherwise, the capacitance is insufficient. The structure is therefore inapplicable for a highly-integrated DRAM circuit. Accordingly, certain three-dimensional capacitor structures have been developed to satisfy the requirements of the high-integrated DRAM circuit which has, for example, more than 16M cells. Among the three-dimensional structures, a trench-type structure and a stack-type structure are the most popular. However, defects are unavoidably generated in the semiconductor substrate of a trench-type capacitor, thus increasing the leakage current. Moreover, as the aspect ratio of a trench increases, the etching rate of the trench is reduced, thereby affecting the productivity of the trench-type capacitor. Therefore, the trench-type capacitor is commercially not that popular as the stack-type capacitor which is free of the problems mentioned above. Many newly-developed techniques are modifications of the stack-type capacitor for the purpose of reducing device dimensions.

In order to increase the capacitance of a capacitor, the thickness of the dielectric layer should be reduced or the electrode surface area has to be increased. As the dielectric layer has been made as thin as possible, and has reached the physical limitation of about 50 Å below which direct carrier tunneling will occur to affect the performance of the capacitor, efforts have been made to improve the capacitance by expanding the electrode surface area.

Among the modifications to the stack-type capacitor structure, a easy and effective method in which the electrode is formed to have a rugged surface has been developed to increase the surface area. However, since the rugged surface is formed before patterning the electrode, only the top region of the electrode retains the rugged structure. The rest of the rugged surface has been etched after the electrode patterning. The improvement of the surface area and the capacitance is therefore limited.

The steps of a conventional DRAM fabrication method will be described in accompaniment with FIG. 2A through FIG. 2C. Referring to FIG. 2A, the DRAM is fabricated over a semiconductor substrate 10 which is, for example, a silicon substrate. An active region is defined over the semiconductor substrate 10 by a field oxide layer 11. Then a gate oxide layer 12, a polysilicon layer 13 and a insulating layer 14 are successively formed over the substrate 10 and are patterned to be a gate structure. The gate structure is utilized as a mask for ion implantation, thereby forming lightly-doped regions 15a and 15b in the semiconductor substrate 10. Moreover, a spacer 16 is formed on sidewall of the gate structure by depositing and etching back a dielectric layer. The spacer 16 and the gate structure are further utilized as a mask for implanting ions in the semiconductor substrate 10, thereby forming heavily doped regions 17a and 17b. A transistor including a gate, a drain and a source region is therefore formed over the semiconductor substrate 10.

The structure of FIG. 2A is then covered by a first insulating layer 18 which is, for example, a deposited BPSG layer. The first insulating layer 18 is patterned to have a contact opening 19 (shown by dashed line in the figure) in which the source region 17a of the transistor is exposed. The contact opening 19 is filled with a conducting layer which electrically connects the source region 17a and extends over the insulating layer 18. The conducting layer is then patterned to be a bit line 20 of the memory device. Moreover, a second insulating layer 21 such as a BPSG layer is deposited over the first insulating layer 18 and the bit line 20. The second insulating layer 21 and the first insulating layer 18 are then both etched to form another contact opening 22 to expose the drain region 17b of the transistor.

The contact opening 22 is then filled with another conducting layer 23 which can be a doped polysilicon layer. The polysilicon layer 23 electrically contacts the drain region 17b of the transistor and extends over the BPSG layer 21. Then a thin conducting layer 24 with rugged surface is deposited over the conducting layer 23. The thin layer 24 can be a polysilicon layer formed by the low-pressure chemical vapor deposition (LPCVD) method.

Referring to FIG. 2B, the thin conducting layer 24 and the conducing layer 23 are patterned according to the capacitor region by a micro lithography method and etching method, thereby forming a storage electrode 25 which consists of the conducting layer 23a and the thin conducting layer 24a.

Referring to FIG. 2C, a dielectric layer 26 is formed over the storage electrode 25 and the exposed surface of the second insulating layer 21. The dielectric layer 26 can be an oxide layer, a nitride layer, a $Ta_2O_5$ layer or a ferroelectric layer. Moreover, another conducting layer such as a CVD polysilicon layer is formed over the dielectric layer 26 and is patterned to be an opposite electrode 27 of the capacitor.

Obviously, the aforementioned fabrication method of a DRAM device forms the thin rugged layer 24 prior to patterning the storage electrode 25 of the capacitor. Therefore, the rugged structure exists merely on the top surface of the storage electrode 25. Since the sidewall of the storage electrode 25 has no rugged structure, the improvement of the capacitance is limited.

SUMMARY OF THE INVENTION

Accordingly, the invention provides a method for fabricating a capacitor which has a rugged structure on the top surface and sidewall of the storage electrode, thereby increasing the surface area of the electrode and improving the capacitance as the dimensions of the capacitor are scaled down.

In order to fabricate a capacitor of a DRAM cell over a semiconductor substrate, the method of the invention comprises the steps of: forming an insulating layer over the semiconductor substrate; forming a contact opening through the insulating layer to expose a portion of the semiconductor substrate; forming a first polysilicon layer over the insulating layer and filling in the contact opening to electrically contact the semiconductor substrate; patterning the first polysilicon layer to the insulating layer surface, thereby forming a trench for defining a capacitor region; forming a thin polysilicon layer with rugged surface over the first polysilicon layer and the insulating layer; forming a mask layer over the thin polysilicon layer, wherein the mask layer has a smaller thickness in the trench bottom than in other regions; removing the mask layer in the trench bottom through an anisotropical etch step; removing uncovered thin polysilicon layer to expose the insulating layer surface; removing the mask layer, thereby forming a storage electrode consisting of the thin polysilicon layer and the first polysilicon layer; forming a dielectric layer over the storage electrode and the exposed insulating layer; and forming a second polysilicon layer over the dielectric layer.

In the present invention, the rugged thin polysilicon layer is formed by low-pressure chemical vapor deposition (LPCVD). Moreover, the mask layer can be an oxide layer which is formed by reacting silane or TEOS.

DETAILED DESCRIPTION OF THE INVENTION

Figure 1:
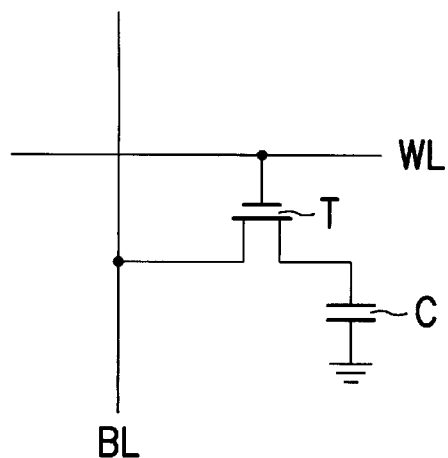
FIG. 1 is a circuit diagram of a conventional DRAM cell.
Figure 2A:
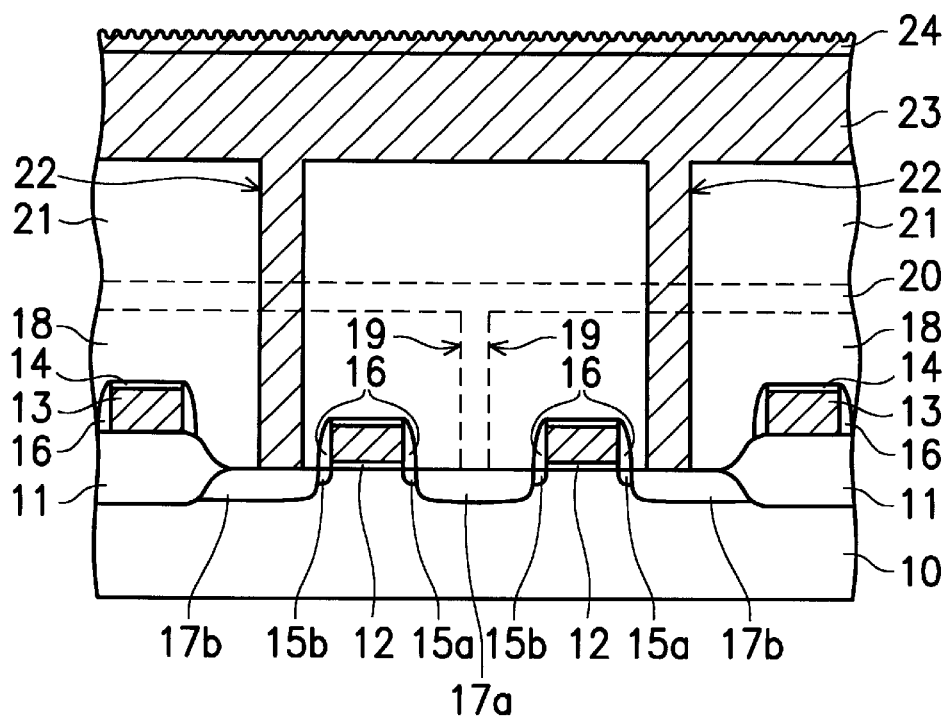
FIG. 2A through FIG. 2C are cross-sectional views illustrating the steps for fabricating a conventional DRAM capacitor.
Figure 2B:
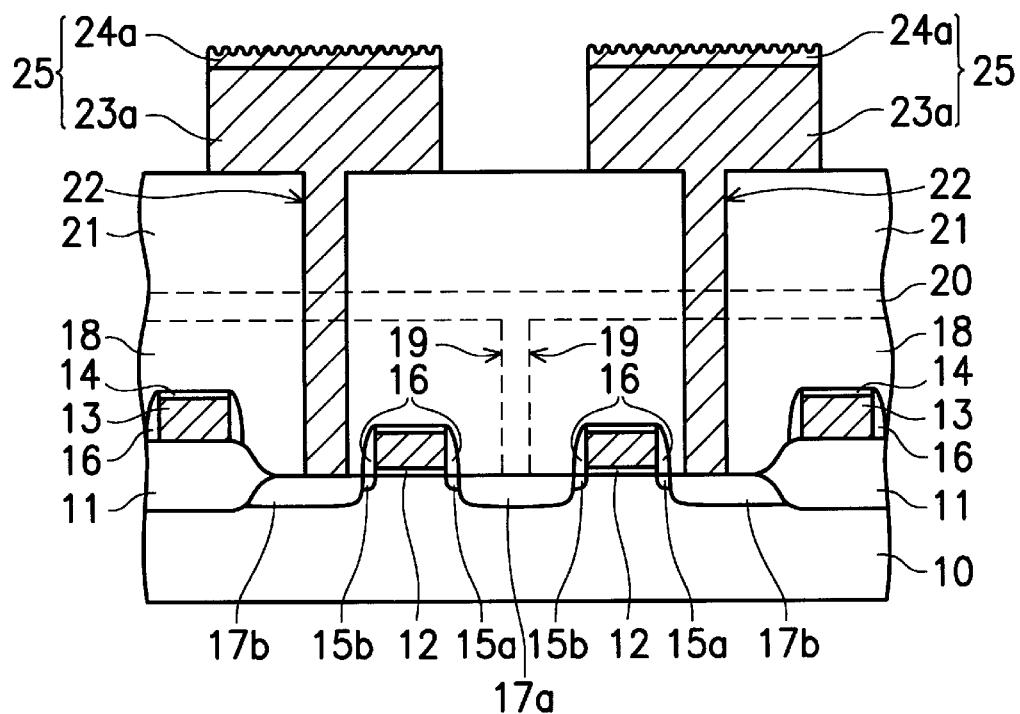
Figure 2C:
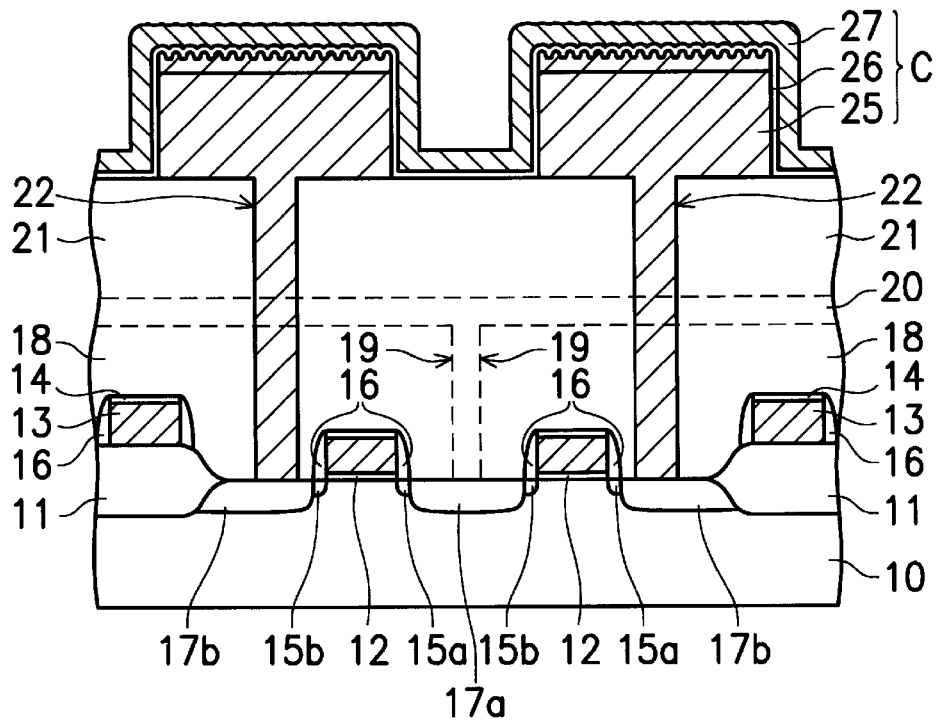
Figure 3A:
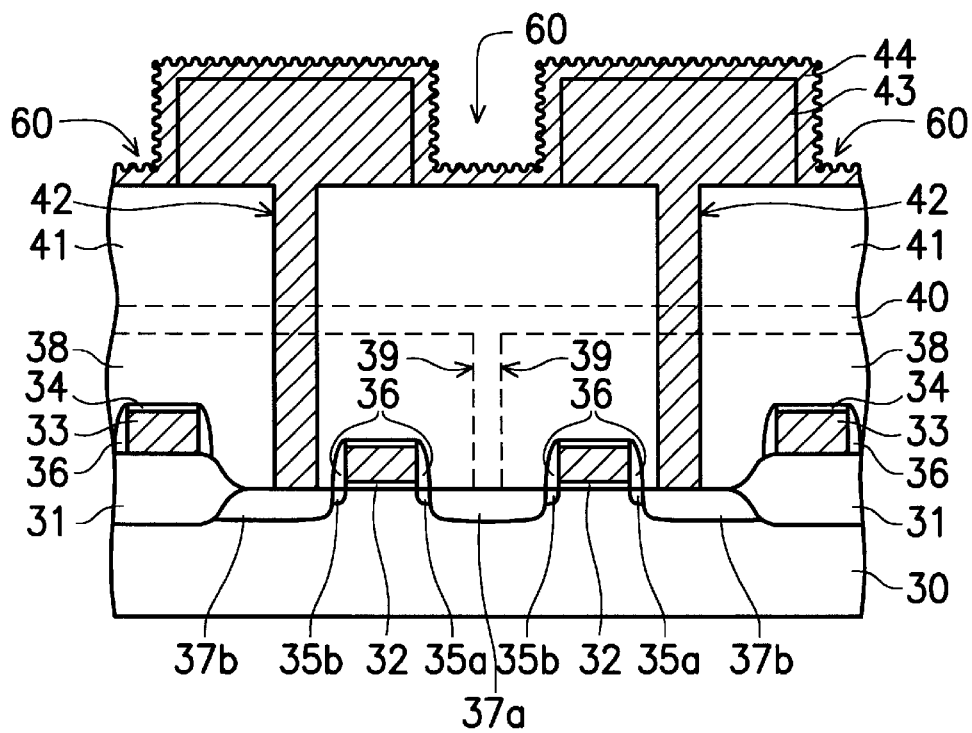
FIG. 3A through FIG. 3F are cross-sectional views illustrating the steps for fabricating a capacitor according to the method of the invention.

Referring to FIG. 3A, a field oxide layer 31 is formed to define an active region over a semiconductor substrate 30 such as a silicon substrate. Then a gate oxide layer 32, a polysilicon layer 33 and an insulating layer 34 are successively formed over the semiconductor substrate 30 and are patterned by micro lithography and etch steps to form a gate electrode. The gate electrode is utilized as a mask for implanting ions in the semiconductor substrate 30, thereby forming lightly doped regions 35a and 35b therein. Moreover, a spacer 36 is formed on sidewall of the gate electrode by depositing and etching back a dielectric layer. The spacer 36 and the gate are both utilized as an implantation mask for forming heavily doped source/drain regions 37a and 37b in the semiconductor substrate 30. Thus, a transistor including the gate and the source/drain regions is formed.

The transistor is then covered by a deposited first insulating layer 38 which is formed by, for example, depositing a BPSG layer. The first insulating layer 38 is etched to form a contact opening 39 (shown by a dashed line in the figure) in which a portion of the semiconductor substrate 30 is exposed. The exposed region is in the source region 37a of the transistor. The contact opening 39 is filled with a conducting layer which electrically contacts the source region 37a and extends over the first insulating layer 38. The conducting layer is patterned to be a bit line 40 of the memory device. Then a second insulating layer 41 such as a BPSG layer is deposited over the first insulating layer 38 and the bit line 40. Moreover, the first insulating layer 38 and the second insulating layer 41 are both patterned to form another contact opening 42 in which a contact region of the semiconductor substrate 30 lying in the drain region 37b is exposed.

The BPSG layer 41 is then covered with a conducting layer 43 which is, for example, a doped polysilicon layer formed by a deposition method. The conducting layer 43 fills in the contact opening 42 to electrically contact the contact region. The conducting layer 43 is patterned through a micro lithography step and an etching step, thereby defining a capacitor region by a trench 60 formed through the conducting layer 43 to the second insulating layer 41. Moreover, a thin conducting layer 44 having a rugged surface is formed over the conducting layer 43 and the second insulating layer 41. The thin conducting layer 44 can be a polysilicon layer formed by LPCVD.

Figure 3B:
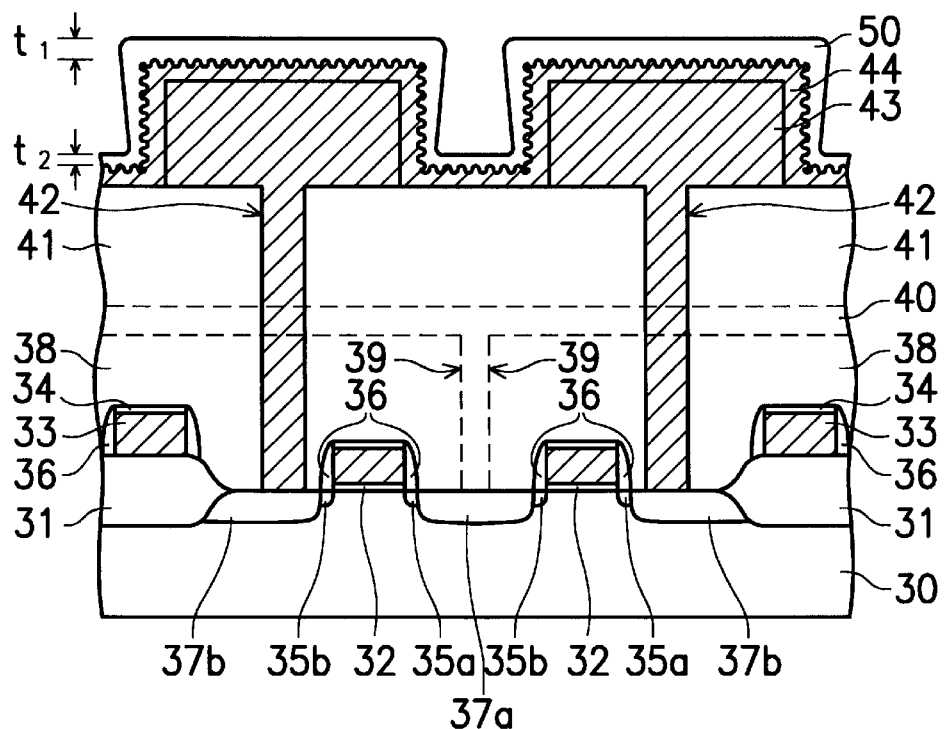

Referring to FIG. 3B, a mask layer 50 is formed over the rugged thin polysilicon layer 44. The mask layer 50 can be an oxide layer formed by reacting silane or TEOS through a plasma-enhanced chemical vapor deposition (PECVD) process. The step coverage ratio of the mask layer 50 is adjusted to have a smaller thickness t2 in the trench bottom than the thickness t1 over the conducting layer 43. For example, if the step coverage ratio is 66%, the thickness t2 is 3300 Å when the thickness t1 approaches 5000 Å.

Figure 3C:
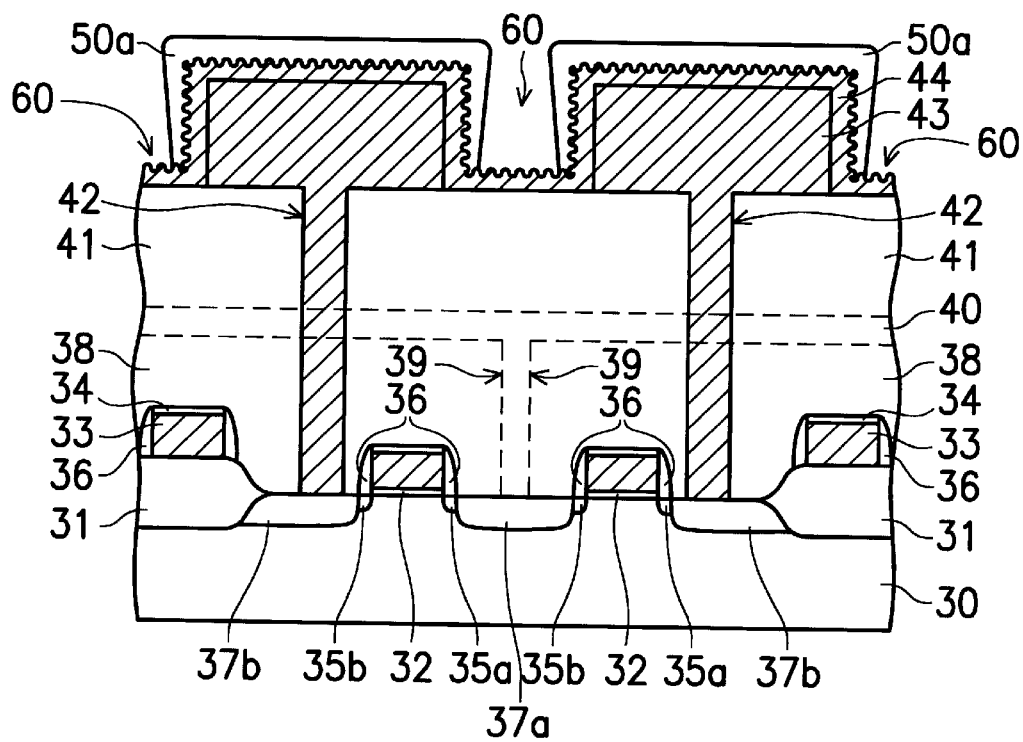
Figure 3D:
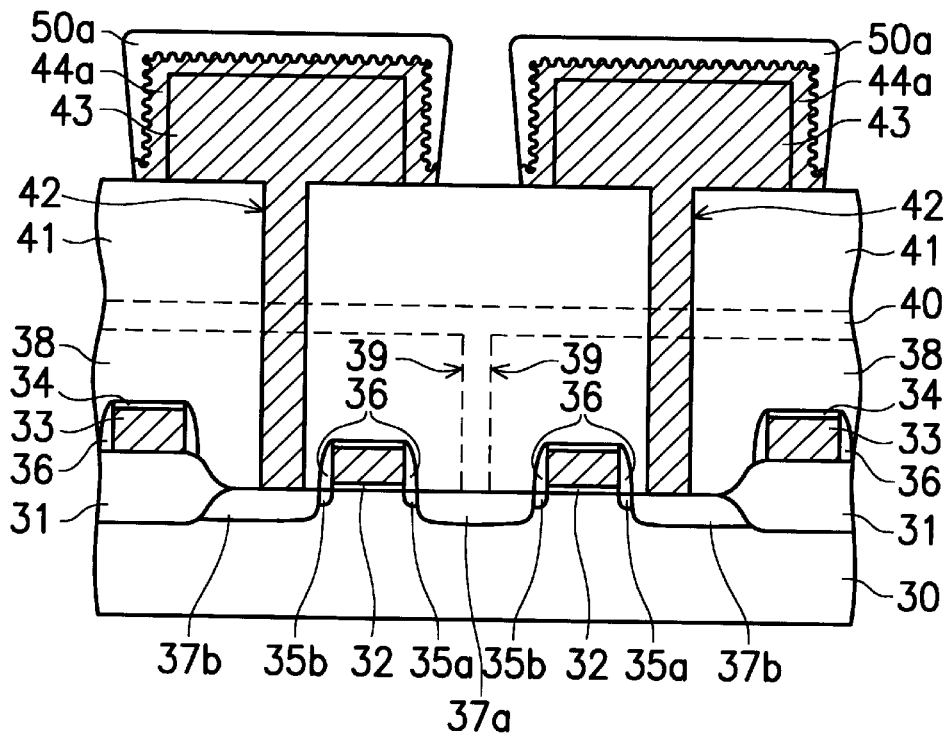

Referring to FIG. 3C, an anisotropical etch step such as a reactive ion etch step is carried out to remove the portion of the mask layer 50 in the trench bottom. Since the mask layer 50 has a larger thickness over and on the sidewalls of the conducting layer 43, the thin polysilicon layer 44 in these regions are still covered by residual mask layer 50a after the anisotropical etch step. The residual mask layer 50a is then utilized as an etching mask for removing the uncovered portions of the thin polysilicon layer 44. Therefore, referring to FIG. 3D, the residual thin polysilicon layer 44a exists over and on the sidewalls of the conducting layer 43.

Figure 3E:
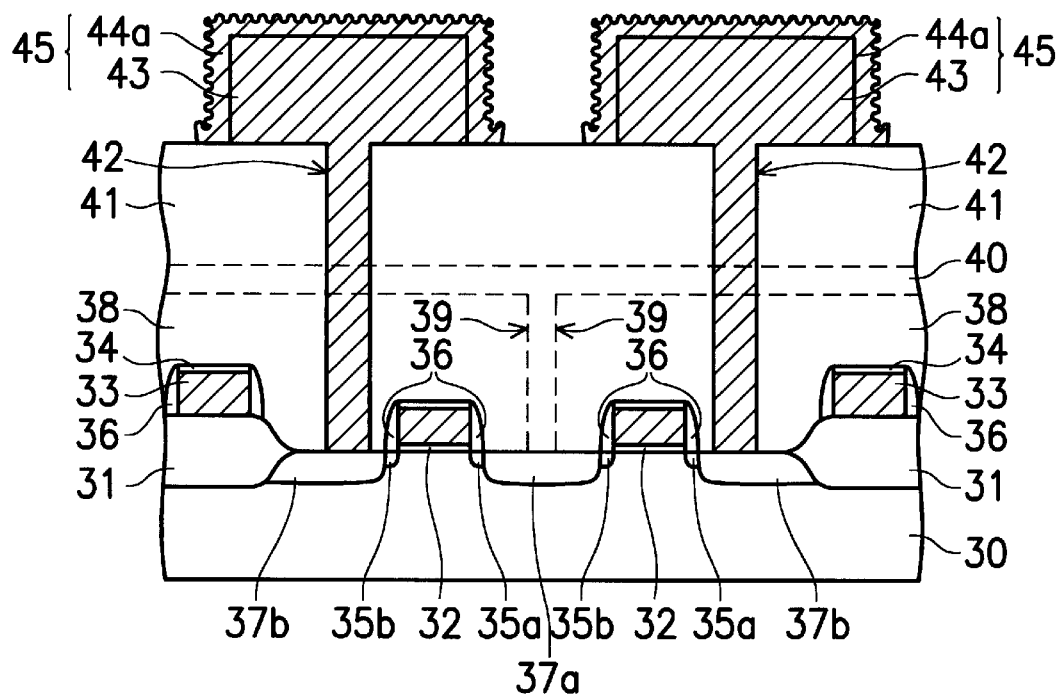
Figure 3F:
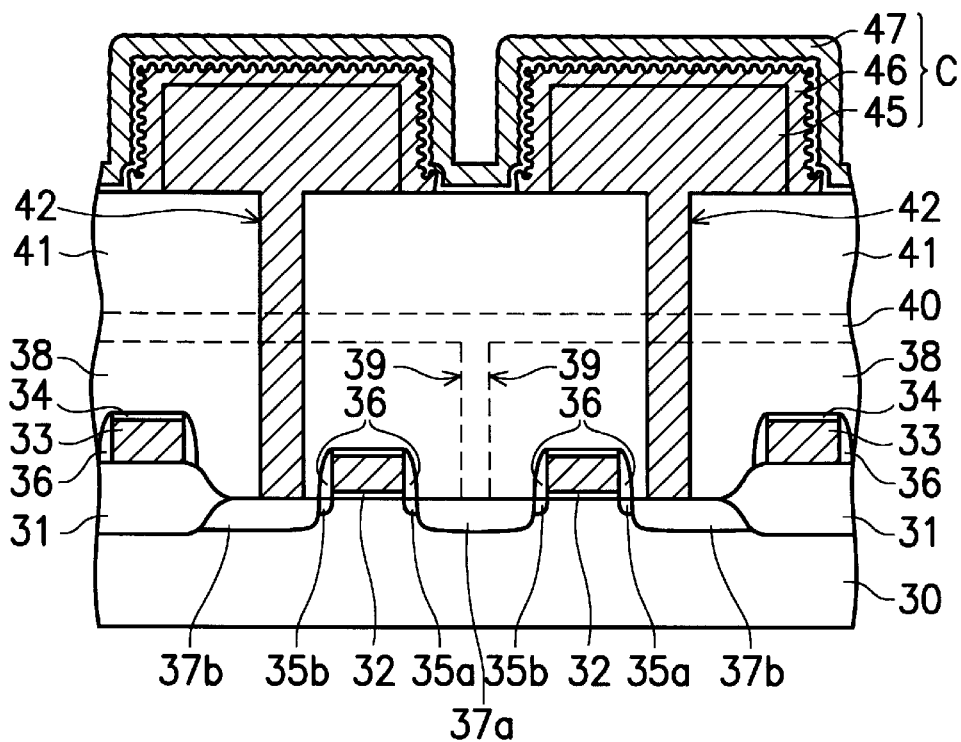

Referring to FIG. 3E, a wet etch step such as an HF-dip process is carried out to remove the mask layer 50a, thereby exposing a storage electrode 45 consisting of the thin polysilicon layer 44a and the conducting layer 43. Further referring to FIG. 3F, a dielectric layer 46 is formed over the storage electrode 45 and the exposed second insulating layer 41. The dielectric layer 46 can be an oxide layer, a nitride layer, a $Ta_2O_5$ layer or a ferroelectric layer. The dielectric layer 46 is finally covered with a second conducting layer which is, for example, a doped polysilicon layer. The second conducting layer is patterned to be an opposite electrode.

The method of the invention forms the thin polysilicon layer after capacitor definition. Moreover, since the thin polysilicon layer over and on sidewalls of the storage electrode is protected by the mask layer 50, the effective surface area of the electrode is largely expanded. The invention therefore increases the capacitance and reduces device defects of the capacitor.

What is claimed is:

1. A method for fabricating a capacitor of a DRAM cell over a semiconductor substrate, comprising the steps of forming an insulating layer over the semiconductor substrate;

forming a contact opening through the insulating layer to expose a portion of the semiconductor substrate;

forming a first polysilicon layer over the insulating layer and filling in the contact opening to electrically contact the semiconductor substrate;

patterning the first polysilicon layer to the insulating layer surface, thereby forming a trench for defining a capacitor region;

forming a thin polysilicon layer with a rugged surface over the first polysilicon layer and the insulating layer;

forming a mask layer over the thin polysilicon layer, wherein the mask layer is thinner in the trench bottom than in other regions;

removing the mask layer in the trench bottom through an anisotropical etch step;

removing the uncovered portions of the thin polysilicon layer to expose the insulating layer surface;

removing the mask layer, thereby forming a storage electrode consisting of the thin polysilicon layer and the first polysilicon layer;

forming a dielectric layer over the storage electrode and the exposed insulating layer; and forming a second polysilicon layer over the dielectric layer.

2. The method as claimed in claim 1, wherein the insulating layer includes a BPSG layer in which a bit line is embedded.

3. The method as claimed in claim 1, wherein the thin polysilicon layer is formed by low-pressure chemical vapor deposition (LPCVD).

4. The method as claimed in claim 1, wherein the mask layer is an oxide layer formed by reacting silane or TEOS.

5. The method as claimed in claim 1, wherein the dielectric layer includes a material selected from the group of oxide, nitride, $Ta_2O_5$ and ferroelectric material.

6. A method for fabricating a storage electrode of a capacitor over a semiconductor substrate, comprising the steps of forming an insulating layer over the semiconductor substrate;

forming a contact opening through the insulating layer to expose a portion of the semiconductor substrate;

forming a first polysilicon layer over the insulating layer and filling in the contact opening to electrically contact the semiconductor substrate;

patterning the first polysilicon layer to the insulating layer surface, thereby forming a trench for defining a capacitor region;

forming a thin polysilicon layer with a rugged surface over the first polysilicon layer and the insulating layer;

forming a mask layer over the thin polysilicon layer, wherein the mask layer is thinner in the trench bottom than in other regions;

removing the mask layer in the trench bottom through an anisotropical etch step;

removing the uncovered portions of the thin polysilicon layer to expose the insulating layer surface; and removing the mask layer, thereby forming a storage electrode consisting of the thin polysilicon layer and the first polysilicon layer.

7. The method as claimed in claim 6, wherein the insulating layer includes a BPSG layer.

8. The method as claimed in claim 6, wherein the first conducting layer is a polysilicon layer.

9. The method as claimed in claim 6, wherein the thin polysilicon layer is formed by LPCVD.

10. The method as claimed in claim 6, wherein the mask layer is an oxide layer which is formed by reacting silane or TEOS.

* * * * *